United States Patent [19]
Zertani et al.

[11] Patent Number: 5,455,416
[45] Date of Patent: Oct. 3, 1995

[54] PREEXPOSURE DEVICE FOR PRINTING FORMS TO BE IMAGEWISE EXPOSED

[75] Inventors: Rudolf Zertani, Mainz; Helmuth Haberhauer, Taunusstein; Norbert Kraemer, Heidenrod, all of Germany

[73] Assignee: Hoechst Aktiengesellschaft, Frankfurt am Main, Germany

[21] Appl. No.: 98,104

[22] Filed: Jul. 28, 1993

[30] Foreign Application Priority Data

Aug. 5, 1992 [DE] Germany .......................... 42 25 829.4

[51] Int. Cl.⁶ ............................. G03T 5/00; G03T 7/00
[52] U.S. Cl. ...................... 250/215; 250/205; 355/71; 355/100; 355/220
[58] Field of Search ............................. 250/205, 215; 355/2, 71, 100, 220

[56] References Cited

U.S. PATENT DOCUMENTS

| | | | |
|---|---|---|---|
| 3,144,331 | 8/1964 | Thommes | 96/27 |
| 3,859,091 | 1/1975 | Wessells et al. | 96/36.3 |
| 4,298,803 | 11/1981 | Matsuura et al. | 250/492.2 |
| 4,716,097 | 12/1987 | Weed | 430/327 |

FOREIGN PATENT DOCUMENTS

| | | |
|---|---|---|
| 1214085 | 4/1966 | Germany . |
| 2412571 | 11/1974 | Germany . |
| 9210461 U | 9/1992 | Germany . |

OTHER PUBLICATIONS

Patent Abstracts of Japan, vol. 12, No. 274 (M–725) Jul. 29, 1988 and JP-A-63 057 262, published Mar. 11, 1988.

*Primary Examiner*—William L. Sikes
*Assistant Examiner*—Fetsum Abraham
*Attorney, Agent, or Firm*—Foley & Lardner

[57] ABSTRACT

A preexposure device having a linear LED arrangement for preexposing printing forms over their full area. The linear LED arrangement comprises at least two rows of LED modules which are offset with respect to one another. Each module is made up of a plurality of light-emitting diodes. The linear LED arrangement is disposed within a housing which is closed off at the bottom by means of a light scattering plate.

14 Claims, 2 Drawing Sheets

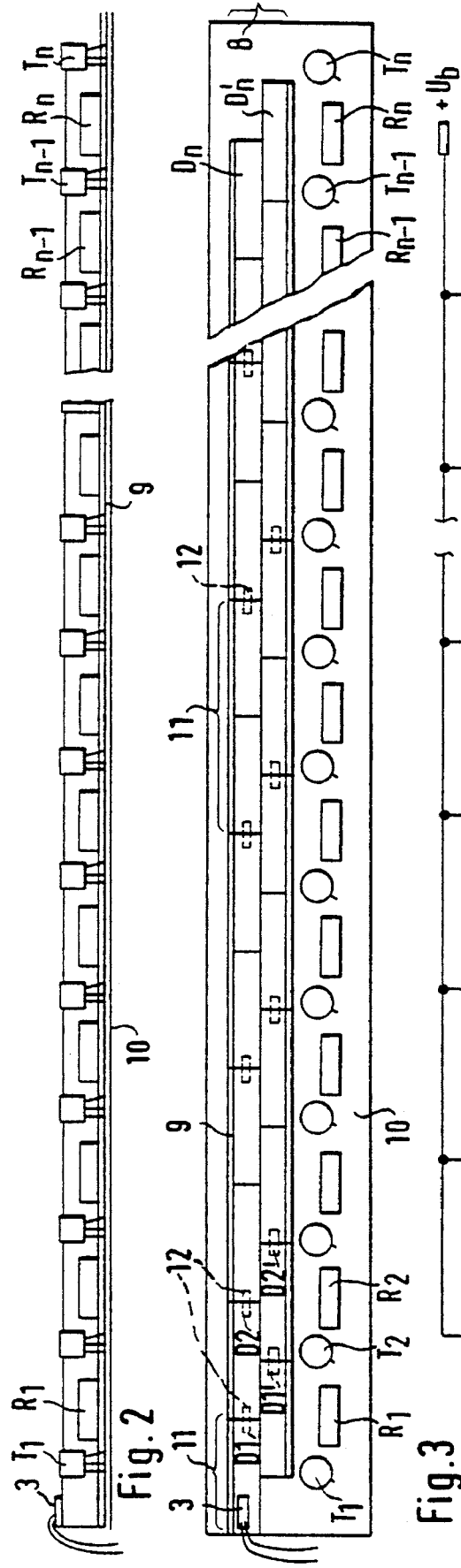
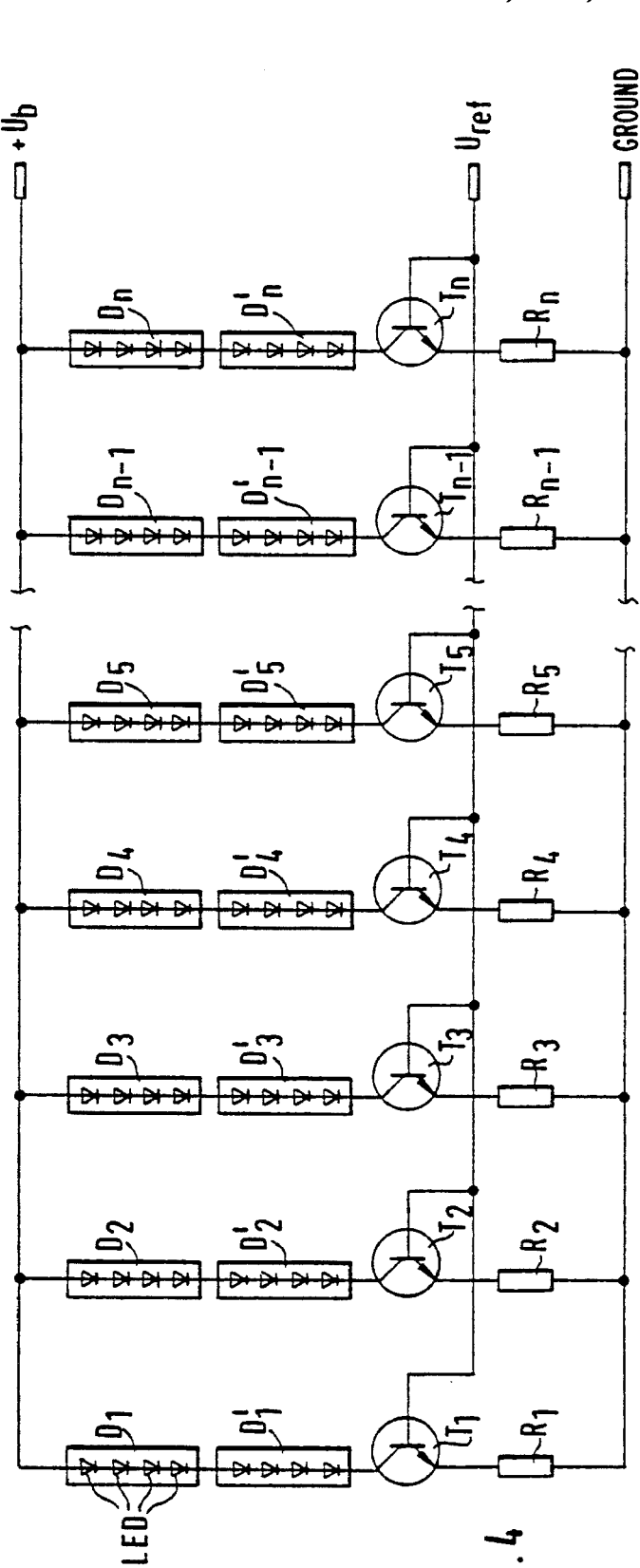
Fig. 2
Fig. 3
Fig. 4

5,455,416

PREEXPOSURE DEVICE FOR PRINTING FORMS TO BE IMAGEWISE EXPOSED

BACKGROUND OF THE INVENTION

The present invention relates to a preexposure device for printing forms or printing plates to be imagewise exposed. More particularly, the present invention relates to a preexposure device comprising a housing which is closed off at the bottom by a plate and in which a radiation source is disposed.

From DE-B 12 14 085 (U.S. Pat. No. 3,144,331) it is known to expose photopolymerizable recording materials which have been applied as a photosensitive layer to a printing plate support and whose sensitivity has fallen due to absorption of molecular oxygen, using 70 to 98% of the radiation dose of an actinic radiation which would be necessary with uniform incidence to initiate a photopolymerization in order to restore the sensitivity. The exposure is carried out through the printing plate support, which is, for example, transparent, an actinic radiation being used which has a wavelength such that only 10 to 70% of the radiation is absorbed by the photopolymerizable layer. In this process, exposure is in principle carried out first diffusely and then image-wise. The diffuse or preexposure is carried out with lower intensity, namely with 70 to 98% of the radiation intensity which is necessary to achieve the full exposure action. This preexposure is then followed by the imagewise exposure with full radiation intensity.

U.S. Pat. No. 4,298,803 discloses a process in which a photoresist layer is preexposed with an intensity which is less than the critical exposure intensity at which the photoresist can be substantially dissolved away at the exposed points. After this preexposure, the imagewise exposure of the photoresist layer is carried out. The sequence of the two exposures can be interchanged. In both cases, the photosensitivity of the photoresist is improved, which considerably shortens the processing time. In the device used for this process, both the imagewise exposure and the preexposure or afterexposure of the photoresist can be carried out by means of an electron beam, or of a UV or X-ray source.

U.S. Pat. No. 4,716,097 likewise discloses a process in which a photopolymeric layer containing a dyestuff is first diffusely and then imagewise exposed to light having a wavelength above 400 nm and an intensity of at least 1500 lumens/m$^2$.

German Offenlegungsschrift DE-A 24 12 571 discloses a process for curing a light-curable polymer layer of a printing plate, in which exposure is first carried out diffusely for a short time and then imagewise until the polymer layer is virtually completely cured in the exposed areas. The diffuse exposure duration is not more than 90% of the time within which the complete curing of the polymer layer takes place with equal intensity of radiation both for the preexposure and for the imagewise exposure.

SUMMARY OF THE INVENTION

Accordingly, it is an object of the present invention to provide a preexposure device for printing forms to be imagewise exposed in which a spectral alteration of the radiation source of the preexposure device does not occur as a result of ageing and a uniform luminosity can be established over the entire length of the respective exposure section of the printing forms.

It is a further object of the present invention to provide a preexposure device for printing forms to be imagewise exposed which can be operated with low voltage and can be adjusted in the range from 0 to 100% of its luminous power.

In accomplishing these objects and others, there has been provided a preexposure device for printing forms having a housing with upper and lower portions and a radiation source disposed therein. The radiation source is a linear LED arrangement comprising at least two rows of modules. Each module, in turn, is made up of a plurality of light-emitting diodes.

The linear LED arrangement preexposes the printing forms moving past the pre-exposure device and underneath the latter over the full area at 25 to 35% of its luminosity. A light scattering plate covers the linear LED arrangement at the bottom, and means are provided for varying the luminosity or luminous-power range of the linear LED arrangement from 0 to 100%.

In one embodiment of the invention, the linear LED arrangement radiates in a wavelength region of 565±20 nm, and the radiated wavelength is greater than the wavelength for the imagewise exposure of the printing form.

Further embodiments of the invention have been provided in which rows of LED modules are offset from one another, and means are provided for varying the luminosity of the LED modules.

Further objects, features and advantages of the present invention will become apparent from the detailed description of preferred embodiments which follows, when considered together with the attached drawings.

BRIEF DESCRIPTION OF THE DRAWINGS

The invention is explained in greater detail below by reference to the drawings, in which:

FIGS. 2 through 4 show a side view, plan view and a circuit of a linear LED arrangement of the preexposure device according to one embodiment of the present invention.

DETAILED DESCRIPTION OF THE PREFERRED EMBODIMENTS

Figure 1:
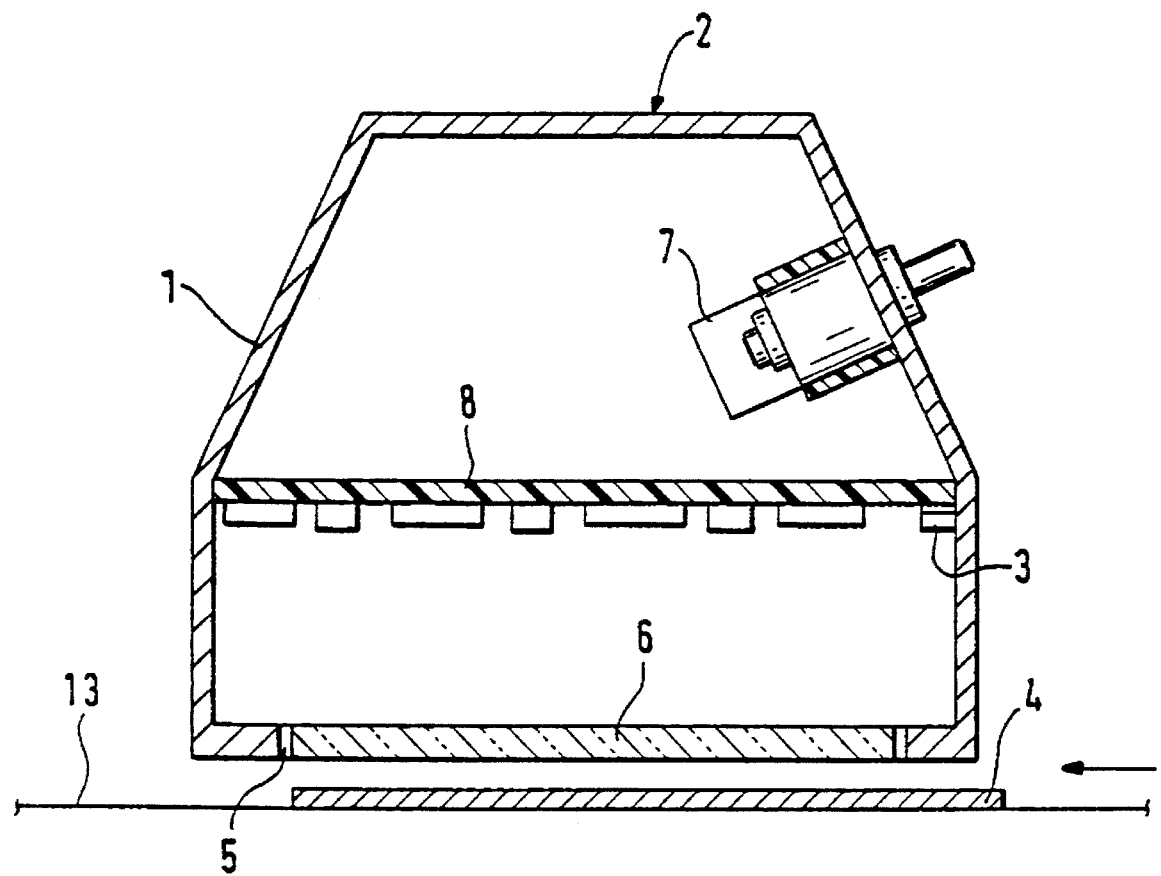
FIG. 1 shows a diagrammatic sectional view of the preexposure device according to the invention.

The preexposure device according to the invention is used to expose photopolymer-coated printing forms, in particular projection plates and highly photosensitive laser plates, in which process, as a result of the preexposure with light of very low and very uniform intensity, the photosensitivity of the printing forms treated in this way can be increased appreciably. For this purpose, the unexposed printing forms which are exposed, for example after preexposure has been carried out, in a laser exposure apparatus having a wavelength of 488 nm or are exposed to a projection exposure by means of a mercury or xenon radiator, flashlight, carbon lamp or the like, are preexposed with very low intensity in the preexposure device to light of a wavelength of $\lambda=565\pm20$ nm. An advantage of this preexposure device is that the luminosity of the radiation source can be adjusted within very wide limits.

The preexposure device 2, shown diagrammatically in section in FIG. 1, has a housing 1 which is closed off at the bottom by a light scattering plate 6 mounted in a housing opening 5 of the underside of the housing. Printing forms 4, one of which is diagrammatically shown in FIG. 1, travel along a conveyance track 13 in the direction of the arrow past the preexposure device 2 and underneath the latter. An electronic control 7 for a radiation source in the form of a linear LED arrangement 8 is accommodated in the housing 1. The luminosity of the radiation source is measured by a sensor 3 which is mounted on the radiation side of the linear LED arrangement.

Together with the light scattering plate 6, the linear LED arrangement 8 provides for the full area diffuse exposure of the printing form 4. This linear LED arrangement 8 comprises at least two rows of LED modules $D_1, D_2, \ldots D_n$ and $D_1', D_2', \ldots D_n'$, which are offset with respect to one another as shown in FIGS. 2 and 3. The linear LED arrangement is situated in a closed housing 1 of the preexposure device 2. At the bottom, in the direction of the conveyance track 13 for printing forms, the housing 1 has the exposure opening 5 which is covered by a light scattering plate 6.

The single module $D_1, \ldots D_n, D_1' \ldots D_n'$ generally comprises four light-emitting diodes (LEDs) which are connected in series, as shown in FIG. 4. Two modules $D_1, D_1'; D_2, D_2' \ldots D_n, D_n'$ are in each case connected in series and are fed with a reference voltage $U_{ref}$ by a current source, which is not shown. Two modules connected in series are in each case controlled by an electrical circuit comprising transistor $T_i$ and current-limiting resistor $R_i$, where i=1, 2, . . . n. The resistor $R_i$ may be a fixed resistor or a variable resistor in the form of a potentiometer. The current source applies the reference voltage $U_{ref}$ to the bases of all the transistors $T_i$, which are connected in parallel. The resistors $R_i$, which are likewise connected in parallel, limit the emitter currents of the transistors $T_i$. The reference voltage $U_{ref}$ is a direct voltage in the range from about 0 to 3 V, in which case a base-emitter current $I_{BE}$ of about 0 to 30 mA flows, or a square-wave voltage in the range from about 0 to 6 V, with a base-emitter current $I_{BE}$ of about 0 to 60 mA, and a duty cycle of about 1:2. The current source of the reference voltage $U_{ref}$ supplies a current in the order of magnitude of about 100 mA and may, for example, be a D/A converter having a buffer stage, or a separate control circuit.

The effective luminosity of the linear LED arrangement 8 is measured by the sensor 3. In order to maintain a uniform illumination over the entire width of the linear LED arrangement 8, LED modules from one manufacturer are used. If differences in brightness nevertheless occur between the individual modules, they are equalized by altering the associated resistor $R_i$.

The LED modules $D_1, D_1', \ldots D_n, D_n'$ are disposed on segments 11 which have equal or different lengths and are plugged together by means of plug contacts 12 to form a printed circuit board 9, as can be seen from FIG. 3. A single module or two to four modules may be disposed on the single segment 11. The plug contacts 12 are indicated by dotted lines in FIG. 3. One segment 11, in each case having one module and two modules in the upper row of the linear LED arrangement 8, is marked by a curved bracket. The plugged-together printed circuit board 9 is mounted on a base printed circuit board 10 on which the transistors $T_i$ and resistors $R_i$ are also disposed. Since the individual segments may have different lengths, the row length can be matched to the width of the printing form to be exposed. As a result of the segmented structure of the linear LED arrangement 8, a rapid replacement is possible in the event of a failure of one or more LED modules since the functioning components do not have to be demounted. No spectral alteration, i.e. no displacement of the wavelength range emitted, occurs with the ageing of the LED. As a result of the current control of the LED modules, a uniform luminous power can be set over the entire length of the linear LED arrangement 8, which is operated by low voltage.

The illuminance of the linear LED arrangement 8 of the preexposure device 2 can be infinitely varied electronically to precisely dose the amount of light applied to the printing form 4 between 0% and 100% of the maximum illuminance. The illuminance of said linear LED arrangement 8 is indicated digitally, the sensor 3 being mounted in the interior of the housing to measure the illuminance. The closed nature of the housing prevents the occurrence of external unwanted radiation which could adversely affect the measurement of the illuminance by means of the sensor 3 in an undesirable way.

The illuminance of the linear LED arrangement 8 is set by the electronic control 7, which is shown diagrammatically above the linear LED arrangement 8.

The spectral distribution of the linear LED arrangement 8 is in the wavelength region of 565±20 nm.

The sensor 3 for measuring the illuminance is normally a photodiode which is situated in the housing 1 of the preexposure device 2 and is thereby screened from any unwanted radiation such as, for example, daylight entering the housing 1. The photodiode is expediently mounted above the printed circuit board 9 (cf. FIG. 2).

The preexposure device 2 achieves the advantages that the linear LED arrangement 8 generates a very uniform exposure intensity over the working width of the printing form 4 and the exposure intensity of the LED modules or of the linear LED arrangement 8 can be infinitely varied. The results of the exposure for different exposure intensities are always reproducible. An ageing of the LED module does not cause a spectral displacement, with the result that the wavelength emitted remains substantially constant. Further advantages of the preexposure device 2 are that no unwanted irradiation can occur in the region of the preexposure device, that the linear LED arrangement 8 can be configured as desired in its length and can be utilized for exposure in its full length, and that it can be operated with low voltage and can be adjusted in the range from 0 to 100% of its luminous power.

What is claimed is:

1. A preexposure device for printing forms to be imagewise exposed, said device comprising a housing having upper and lower portions, a radiation source disposed within said housing, and means for varying the intensity of said radiation source over a luminous power range of between 0 and 100%, said lower portion of said housing comprising a light scattering plate, said radiation source comprising a linear LED arrangement, and said linear LED arrangement further comprising at least two rows of modules, each of said modules comprising a plurality of light emitting diodes, wherein said linear LED arrangement is coextensive with said forms and operated at 25 to 35% of its full luminosity so as to preexpose the full breadth of said printing forms as they pass.

2. A preexposure device as recited in claim 1, wherein said linear LED arrangement radiates in a wavelength region of 565±20 nm, and wherein the radiated wavelength is greater than the wavelength required for the imagewise exposure of said printing forms.

3. A preexposure device as recited in claim 1, wherein the linear LED arrangement comprises rows of LED modules, said rows being offset with respect to one another, and said modules each comprising a plurality of light emitting diodes.

4. A preexposure device as recited in claim 3, wherein each individual module contains four light-emitting diodes (LEDs) which are connected in series.

5. A preexposure device as recited in claim 3, wherein pairs of modules are in each case connected in series and means are provided for controlling the luminosity of said pairs, said controlling means comprising in each case a transistor, a resistor and a common current source for all the modules which supplies a reference voltage $U_{ref}$ to the base of said transistors.

6. A preexposure device as recited in claim 5, wherein said resistor is a variable resistor.

7. A preexposure device as recited in claim 5, wherein the bases of said transistors are connected in parallel and said resistors are connected in parallel between the emitters of said transistors and a ground conductor.

8. A preexposure device as recited in claim 5, wherein the reference voltage $U_{ref}$ is a square-wave voltage having a duty ratio of 1:2.

9. A preexposure device as recited in claim 3, wherein the linear LED arrangement comprises individual segments which are plugged together by means of plug contacts to form a printed circuit board.

10. A preexposure device as recited in claim 9, wherein the segments are of equal length.

11. A preexposure device as recited in claim 9, wherein said segments exhibit one of at least two different lengths.

12. A preexposure device as recited in claim 9, further comprising means for measuring the luminosity of said linear LED arrangement, said measuring means comprising a photodiode disposed on said printed circuit board, wherein said photodiode and said printed circuit board are both disposed within said housing.

13. A preexposure device as recited in claim 1, further comprising means for measuring the luminosity of said linear LED arrangement disposed within said preexposure device.

14. A preexposure device as recited in claim 13, wherein said measuring means comprises a photodiode disposed within said upper portion of said housing.

* * * * *